(12) United States Patent
Ashkin

(10) Patent No.: US 8,546,686 B2
(45) Date of Patent: Oct. 1, 2013

(54) SOLAR ENERGY COLLECTION SYSTEM

(76) Inventor: Arthur Ashkin, Rumson, NJ (US)

( * ) Notice: Subject to any disclaimer, the term of this patent is extended or adjusted under 35 U.S.C. 154(b) by 0 days.

(21) Appl. No.: 12/631,468

(22) Filed: Dec. 4, 2009

(65) Prior Publication Data

US 2010/0139739 A1   Jun. 10, 2010

Related U.S. Application Data

(60) Provisional application No. 61/176,748, filed on May 8, 2009.

(51) Int. Cl.
*H01L 31/052* (2006.01)

(52) U.S. Cl.
USPC .......... 136/259; 136/246; 136/252; 136/244; 359/853; 359/595; 126/675; 126/684; 126/698; 126/709

(58) Field of Classification Search
USPC ............... 136/259, 246, 252, 244; 359/853, 359/595; 126/675, 684, 698, 709
See application file for complete search history.

(56) References Cited

U.S. PATENT DOCUMENTS

| | | | | |
|---|---|---|---|---|
| 3,218,924 A | * | 11/1965 | Miller | 359/456 |
| 3,232,795 A | * | 2/1966 | Snyder et al. | 136/246 |
| 3,427,200 A | * | 2/1969 | Ernest et al. | 136/246 |
| 3,899,672 A | * | 8/1975 | Levi-Setti | 359/869 |
| 3,923,381 A | * | 12/1975 | Winston | 359/852 |
| 4,003,756 A | * | 1/1977 | Abrams | 136/246 |
| 4,029,519 A | * | 6/1977 | Schertz et al. | 136/246 |
| 4,045,246 A | * | 8/1977 | Mlavsky et al. | 136/246 |
| 4,077,393 A | * | 3/1978 | Mattson | 126/709 |
| 4,078,548 A | * | 3/1978 | Kapany | 126/648 |
| 4,088,121 A | | 5/1978 | Lapeyre | |
| 4,114,592 A | * | 9/1978 | Winston | 126/683 |
| 4,140,142 A | * | 2/1979 | Dormidontov et al. | 136/246 |
| 4,248,643 A | * | 2/1981 | Peters | 136/248 |
| 4,284,839 A | * | 8/1981 | Johnson | 136/246 |
| 4,863,224 A | | 9/1989 | Afian et al. | |
| 5,118,361 A | * | 6/1992 | Fraas et al. | 136/246 |
| 5,280,557 A | * | 1/1994 | Nwasokwa | 385/146 |
| 5,611,870 A | * | 3/1997 | Horne et al. | 136/253 |
| 5,865,905 A | | 2/1999 | Clemens | |
| 6,201,179 B1 | * | 3/2001 | Dalacu | 136/244 |
| 6,274,860 B1 | | 8/2001 | Rosenberg | |
| 6,276,359 B1 | | 8/2001 | Frazier | |
| 6,528,716 B2 | * | 3/2003 | Collette et al. | 136/246 |
| 6,666,207 B1 | | 12/2003 | Arkas et al. | |
| 6,903,261 B2 | | 6/2005 | Habraken et al. | |
| 7,164,839 B2 | | 1/2007 | Nyhart, Jr. et al. | |
| 2002/0007845 A1 | | 1/2002 | Collette et al. | |
| 2008/0184990 A1 | | 8/2008 | Tuchelt | |
| 2008/0185034 A1 | | 8/2008 | Corio | |
| 2008/0223443 A1 | | 9/2008 | Benitez et al. | |

* cited by examiner

*Primary Examiner* — Golam Mowla
(74) *Attorney, Agent, or Firm* — Wendy W. Koba

(57) ABSTRACT

A solar collector utilizes multiple reflections of light passing down a tapered, pyramidal-type structure made of highly-reflective mirrored surfaces. A right-angled truncated reflective pyramidal structures have been discovered to have many properties which make them superior to existing concentrator geometries. The use of a tapered, pyramidal-type structure creates multiple reflections which appear at the collector output in the form of a Buckminster-Fullerene display, providing improved collector efficiency and amplification when compared to prior art "concentrators" of the Fresnel lens or parabola type.

9 Claims, 13 Drawing Sheets

SOLAR ENERGY COLLECTION SYSTEM

CROSS-REFERENCE TO RELATED APPLICATIONS

This application claims the benefit of U.S. Provisional Application No. 61/176,748, filed May 8, 2009 and herein incorporated by reference.

TECHNICAL FIELD

The present invention relates to a solar energy collection system and, more particularly, to a solar collector of a preferred tapered geometry that allows for significantly improved concentration efficiency, while also relaxing the requirements on tracking the movements of the sun; the inventive system also provides a means of reducing energy generation costs well below those associated with standard fossil fuels.

BACKGROUND OF THE INVENTION

Most present day energy usage is derived from the sun. This comes largely from the burning of fossil fuels. Such usage has caused vast environmental problems, starting from as early as the Industrial Revolution and continuing today at an almost unabated pace. Indeed, the subsequent neglect of these growing problems has given rise to the present-day situation, calling for rapid remediation on the scale of a few years.

Direct use of solar energy in photovoltaic (PV) and thermal systems is probably the most desirable—yet least used—of the so-called "green technologies" under consideration for overcoming environmental problems for home, industrial and/or large-scale usage. High construction costs and the difficulty of achieving high solar cell efficiencies are the principal factors in preventing the extensive use of most presently-available systems. Most efforts to reduce costs of solar systems are centered on improving the efficiency and cost of the solar cells themselves. For example, extensive work is underway on improving cells made of single crystal silicon and other PV materials (such as, for example, plastic films based on polysilicon, organic PV material, inorganic PV material, and the like). New physical properties, such as large charge multiplication and high voltage charge extraction, are also being studied. The present cost of production of the best solar PV cells is approximately $3-$6 per watt, which is prohibitive when compared with a current cost of about $0.50 per watt for fossil fuels. Presently, government subsidies are attempting to make up the difference in cost in order to advocate for the solar cell alternative.

Most current solar systems for residential or business use are based on large arrays of planar, flat-plate solar PV panels set out on rooftops. Also, thin-film PV systems are being tested on vast stretches of desert floor for large-scale power plant use, for example. The flat-plate design requires that the active area of the collector be essentially equal to the area of the PV material exposed to one sun radiation. That is, there is a one-to-one ratio of active collector area to PV cell area. The cost of a one-sun flat plate module is mostly governed by the cost and efficiency of the PV material that is used to cover the active module area. Therefore, in order to reduce the cost of a flat-plate module, the PV base material must be made less expensive, or more efficient, or both. Many organizations are investigating thin-film photovoltaic technologies to address the issue of lowering the cost of the PV base material. All thin-film approaches thus far have lowered the cost of the PV material, but at the expense of module efficiency.

Other approaches to achieve solar generation involve use of solar concentrating systems. These systems generally use parabolic mirror collectors or Fresnel lenses in various configurations to focus and concentrate the sun's light onto small-area PV cells, or fluid-filled thermal absorbers for driving turbines or other heat-generating systems. The concentration ratio is defined as the input power:output power and in these designs may vary from 1.5:1 to over 1500:1. Traditionally, design approaches for concentrating collectors have been large and bulky, using Fresnel lenses or large area parabolic reflectors. These arrangements have large single-element focusing optics, requiring highly accurate and expensive feedback-controlled solar tracking mechanisms.

One exemplary prior art solar concentrator that addresses some of these concerns is described in U.S. Pat. No. 6,276,359 issued to S. Frazier on Aug. 21, 2001. The Frazier arrangement comprises a "double reflecting" solar concentrator that utilizes a primary parabolic reflective surface in combination with a secondary reflective surface. The incident light reflects off the secondary surface away from the primary parabolic surface's natural focus point toward a second focal point positioned on (or substantially near) the surface of the primary parabolic reflective surface. This optical path results in a narrower field of view at the receiver, which can improve the costs of some PV arrangements. The efficiency of this arrangement, however, remains limited in terms of the angle of acceptance of the incoming radiation and the need to accurately track the movement of the sun to provide a practical arrangement.

U.S. Pat. No. 6,666,207 issued on Dec. 23, 2003 to E. Arkas et al. discloses a solar concentrator formed into the shape of a spiral horn, where the horn is adapted to concentrate, by multiple reflections from the internal light-reflecting surface of the horn, solar energy incident within a predetermined range of angles. In particular, a preferred embodiment of the Arkas et al. design utilizes a spiral horn having the geometry of the well-known "Golden Spiral". While potentially interesting from a design point of view, the formation of such a spiral horn had extensive manufacturing difficulties which may result in a cost-prohibitive option.

Long parabolic troughs are used in many conventional solar collector systems, where only the elevation is feedback-controlled (that is, azimuthal control is not a concern). The design of such a trough system is based on a technique called "non-imaging optics". This type of analysis considers principally the power concentration features of solar collectors and totally neglects the imaging features which can often be complex and highly aberrated.

The state of the art approaches have not adequately addressed the issues of optical efficiency, optical cost, heat dissipation, solar tracking tolerance and size and weight concerns. Although interest in solar energy usage is high, experts predict it will take years (varying from a few years to a few decades) and large investments of capital and possibly government subsidies to significantly reduce our dependence on fossil fuels.

SUMMARY OF THE INVENTION

The present invention addresses the needs remaining in the prior art and discloses a new type of solar collector system that is capable of converting solar energy into electrical energy and heat at a very low cost and high efficiency.

A solar collector has been formed in accordance with the present invention which utilizes multiple reflections of light passing down a tapered, pyramidal-type structure made of highly-reflective and planar mirrored surfaces. In particular, right-angled truncated reflective pyramidal structures have been discovered to have many properties which make them much superior to existing concentrator geometries.

It has been discovered that the use of a tapered, pyramidal-type structure creates multiple reflections which appear at the collector output in the form of a Buckminster-Fullerene display, providing improved collector efficiency and amplification, while being much less expensive than prior art concentrators of the Fresnel lens or parabolic type.

It is an advantage of the solar collector system of the present invention that the truncated pyramidal collector is less sensitive to the movement of the sun than the prior art conventional arrangements. In particular, the truncated pyramidal collector of the present invention is more than an order of magnitude less sensitive to the sun's acceptance angle than parabolic and other lens-like collectors. This insensitivity to acceptance angle eliminates the need for the above-mentioned expensive two-axis tracking apparatus as required for use with conventional parabolic collectors (which are known to be extremely sensitive to small collector misalignments).

Additionally, the reduced sensitivity to acceptance angle allows for the system of the present invention to operate at quite high efficiency even under cloudy or hazy skies. These are conditions where parabolic collectors are inoperable. In particular, it has been observed that the truncated pyramidal collector of the present invention exhibits increased collection levels under hazy conditions, as a result of increased scattering of light within the haze coupled with the structure's ability to capture the scattered rays and reflect them towards the solar receiver. This results in a significant increase in collected power over conventional solar parabolic systems. Moreover, the wide acceptance angle of the inventive arrangement allows for the collectors themselves to be relatively "low precision" devices—tolerant of flaws in collector geometry, such as distortions from rippled mirror surfaces. Indeed, these types of flaws render conventional systems inoperable.

It is another advantage of the present invention that the tapered pyramidal geometry of planar, mirrored sidewalls is significantly less expensive to manufacture and implement than the prior art "spiral horn" arrangement described above. Indeed, the square-based truncated pyramidal solar collector embodiment of the present invention can be formed as a ziggurat-like structure resembling a series of terraced steps that is lightweight and inexpensive. The circular conic embodiment of the present invention is readily fabricated for relatively small dimensions (such as may be utilized in residential applications), but may be more difficult in larger sizes—where any of the multi-sided truncated pyramidal arrangements (triangular, square, rectangular, pentagonal, or the like) may be more appropriate.

Other and further advantages and aspects of the present invention will become apparent during the course of the following discussion and by reference to the accompanying drawings.

BRIEF DESCRIPTION OF THE DRAWINGS

Referring now to the drawings.

DETAILED DESCRIPTION

Figure 1A:
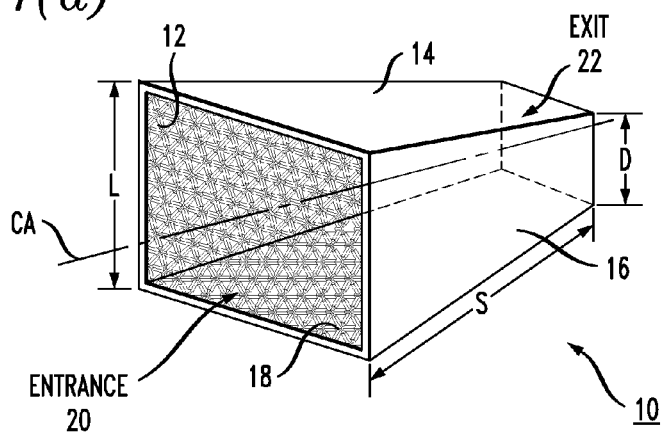
FIG. 1(a) shows a right-angled, truncated pyramidal solar collector formed in accordance with the present invention, having a square geometry input and output face.

A novel way of concentrating radiant energy using multiple reflections of light passing down a tapered pyramidal-type structure made from highly-reflective mirrored surfaces is the subject of the present invention. It has been discovered that tapered structures such as these have many properties that make them not only useful, but superior to existing solar collectors. FIG. 1(a) illustrates an exemplary embodiment of a right-angled truncated pyramidal solar collector 10 formed in accordance with the present invention. In this case, collector 10 utilizes a square geometry entrance port and exit port, with tapered reflective sidewalls disposed therebetween. That is, collector 10 is formed of a set of four tapered, planar reflective sidewalls 12, 14, 16 and 18. Collector 10 is shown as having an entrance 20 of dimension L (and area, therefore, of $L^2$). Collector 10 has a length S, tapering downward to an exit 22 of dimension D (and area of $D^2$). Although not explicitly shown, it is to be understood that in implementation, a transparent covering is placed over entrance 20 to prevent rain, snow, debris, etc. from entering collector 10 and obstructing its reflective properties.

In accordance with the present invention, parallel light rays, such as from the sun, enter collector 10 within an acceptance angle that transports all of the rays at entrance 20 toward exit 22, propagating along collector axis CA. Depending on the angle of the incoming rays with respect to axis CA, they will make a number of reflections of increasing angle with respect to mirrored surfaces 12, 14, 16 and 18 as they proceed down the length of concentrator 10 to exit 22. At exit 22, the rays are concentrated and collected by a PV panel or a thermal absorber (not shown). This optical behavior is similar to the "walk-off" that occurs in misaligned planar mirrors in open laser resonators. This behavior can also be thought of as a version of the "barber-shop effect" when two slightly tilted mirrors on opposite walls of barber shop reflect multiple images. Another very useful way of viewing this reflective behavior is as a simple application of *Fermat's Principle of Least Time* in which each ray follows a single straight line path from a "virtual sun" source to the output face. Each "virtual sun" is a mirror image of the real sun, located the same perpendicular distance behind the reflecting mirror, as the real sun is in front of the mirror.

Figure 2:
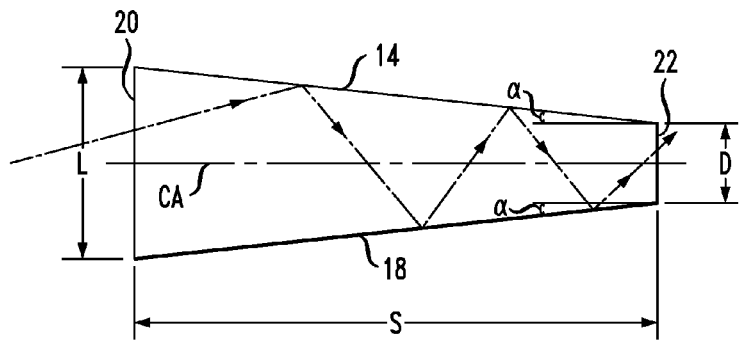
FIG. 2 is a cut-away side view of the collector of FIGS. 1(a) and (b), taken along collector axis CA.

FIG. 2 is a cross-sectional side view of collector 10, illustrating the parameters L, D and S and showing the relationship that is used to configure the concentrator in accordance with the present invention. The angle $\alpha$ is defined as the taper angle of the collector sidewalls with respect to the collector axis CA. As shown, the four parameters L, D, S and $\alpha$ are used to define the geometry of the truncated, right-angled pyramidal collector based on a square-shaped input of area $L^2$ and a square-shaped output of area $D^2$. Indeed, the length S is defined by the geometry as:

$$S = \frac{\left(\frac{L}{2} - \frac{D}{2}\right)}{\tan\alpha}. \quad (1)$$

Using this relation, it is possible to calculate any parameter of the collector given the other three. Alternatively, characteristics of the collector's behavior can be determined by, for example, by holding one of the parameters and allowing the others to vary.

Figure 3:
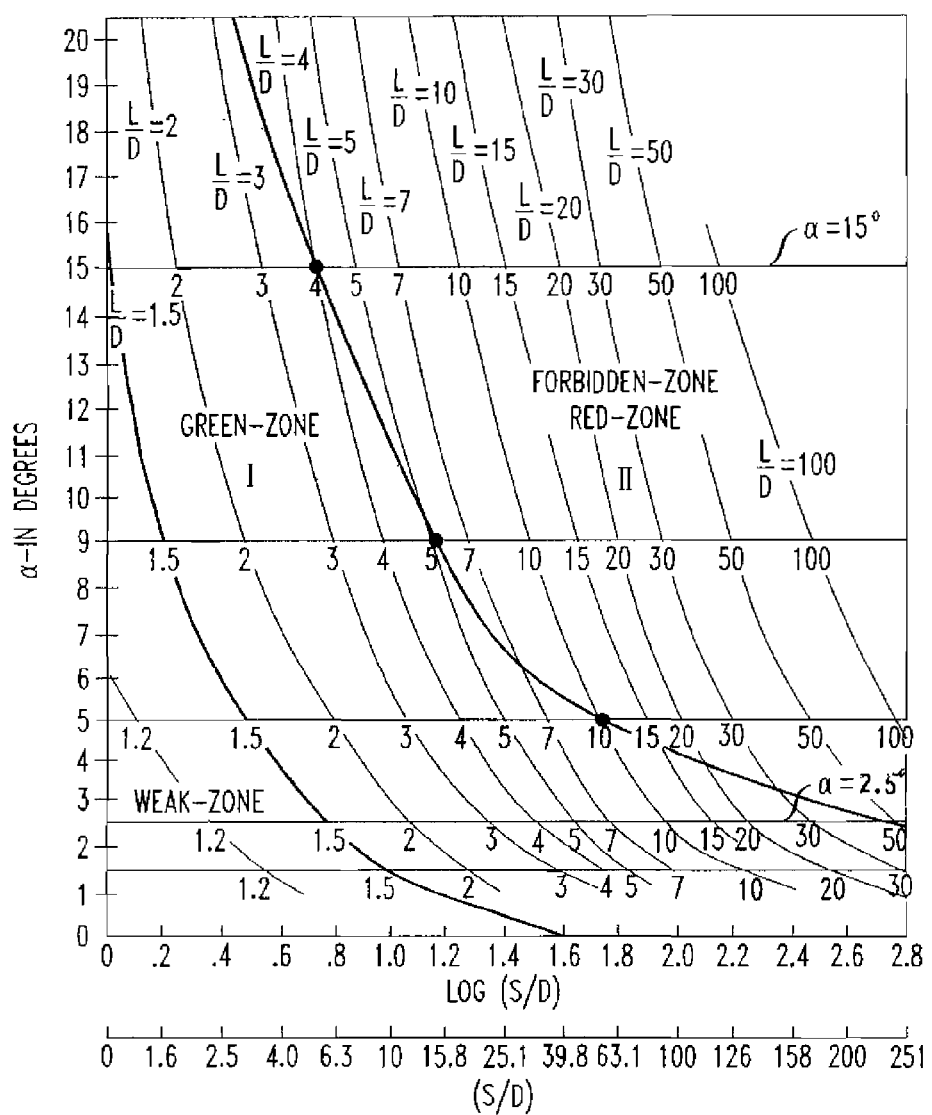
FIG. 3 is a master diagram derived from the geometry of the solar collector of FIG. 1(a)

FIG. 3 is the master diagram, basic to the understanding of the present invention, illustrating the relationship between the parameters as shown in equation (1). In the master diagram of FIG. 3, the parameter $\alpha$ is shown along the y-axis; the quantities (S/D) and log(S/D) are displayed on the x-axis. By selecting different values of (L/D), the corresponding values of $\alpha$ can be computed from equation (1). These values are plotted as a series of curves showing all possible collector parameters for each of these chosen values of (L/D). This master diagram is the basis used to derive a preferred set of structural dimensions forming the collector of the present invention. It is to be understood, however, that the master diagram of FIG. 3 is associated with the particular geometry of square-based collector 10 of FIG. 1(*a*). When using other collector geometries (i.e., triangular-based truncated pyramid, pentagon-based truncated pyramid, or the like), a different set of relationships will be created and used to determine a preferred set of dimensions L/D, S and $\alpha$. For example, FIG. 1(*b*) illustrates an alternative collector 10C of the present invention, formed of a conic structure with a circular entrance 11 of radius R and area $\pi R^2$ and a circular exit 13 of radius r and area $\pi r^2$. As shown, entrance 12 of the arrangement of FIG. 1(*a*) can be inscribed within entrance 11 of collector 10C. Indeed, for a conical collector with a circular cross-section, the incoming rays will spiral about the axis and give rise to a ring-type pattern of images emerging from circular exit 13.

Figure 1B:
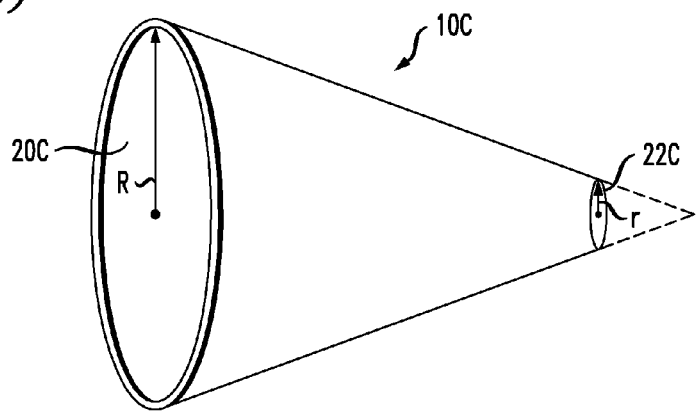
FIG. 1(b) is a variation of the collector of FIG. 1(a), in this case being of conic form with a circular geometry input and output face.

The collection efficiency, or amplification factor A, is given by $(L/D)^2$ for the arrangement of FIG. 1(*a*), assuming that all the power entering collector entrance 20 (defined by area $L^2$) passes through collector exit 22 (defined by area $D^2$). In the master diagram of FIG. 3, the (L/D) values range from approximately one to one hundred, with an amplification A of approximately $(1-10^4)$ for values of $\alpha$ of approximately $(1°-20°)$, with (S/D) values ranging from (0-600).

For a given value of $\alpha$, the master diagram of FIG. 3 shows that there is only a limited range of possible collector geometries for which there is no reflection of any input power. This fact implies that there are two zones: a first zone, shaded and labeled "I" in the master diagram of FIG. 3, in which all of the input power is concentrated by the collector and exits through collector exit 22, and a second zone, labeled "II", in which an increasing fraction of the input power is retro-reflected back out through collector entrance 20. For some collectors, not all of the input power exits the collector but instead is retro-reflected back out through collector entrance 20. This is due to the fact that for these collectors the many reflections that occur as the light proceeds down the collector can increase in angle with respect to axis until it exceeds 90°, at which point it retro-reflects. This behavior is discussed below in paragraph [0043]. Therefore, the parameters within "zone I" are those which are selected to form collectors in accordance with the present invention. Regardless of the geometry of the entrance/exit of the collector structure (i.e., circular, square, triangular, pentagonal, etc.), there will always be a preferred "zone I" in the associated master diagram where there is no reflection of input power.

Still referring to the master diagram of FIG. 3, a line is drawn across the master diagram at the value $\alpha=15°$, which illustrates the range of (L/D) values over which zero-reflection, one-reflection, and two-reflection beamlets are generated. In general, additional power output can be obtained with the same dimension D of exit 22, but using a smaller collector angle $\alpha$. The smaller angle provides a larger amplification by virtue of the fact that larger values of (L/D) occur for smaller angles of $\alpha$. This then leads to higher power output. This higher power output does come at the expense of a larger length S of collector 10.

For example, with reference to the value of $\alpha=2.5°$, it can be seen that an amplification of A=2500 can be achieved from an (L/D) value of 50. Theoretically, there is no limit to the amount of power that may be collected. This master diagram is based on a purely geometric optics model where diffraction effects are neglected. Diffraction effects, however are negligible for essentially all pyramidal-type collectors.

Figure 4A:
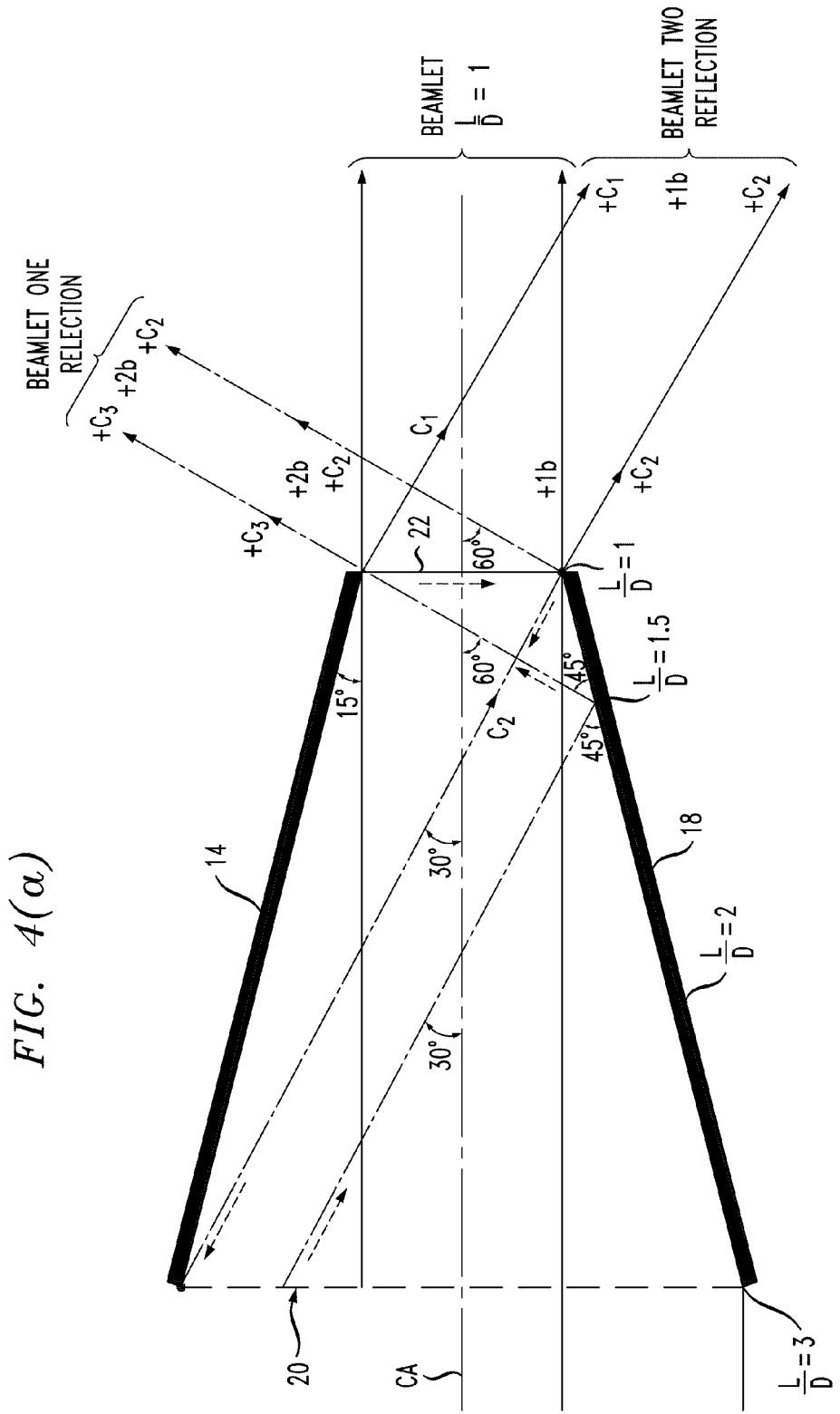
FIG. 4(a) contains a diagram showing the paths of various solar rays propagating through the collector of FIG. 1(a)
Figure 4B:
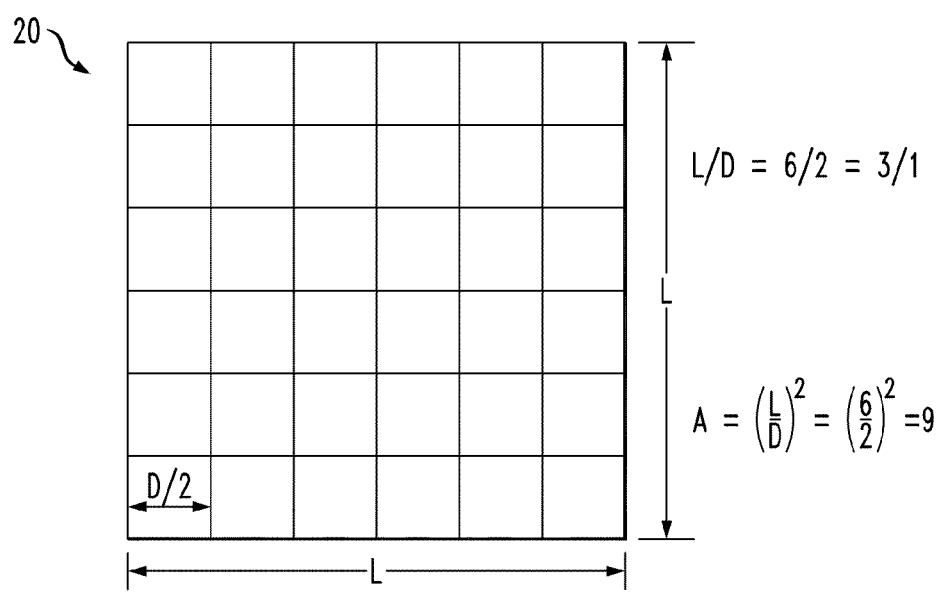
FIG. 4(b) depicts the normalization applied to the ratio of the input and output faces of the collector of FIG. 1(a)
Figure 4B:
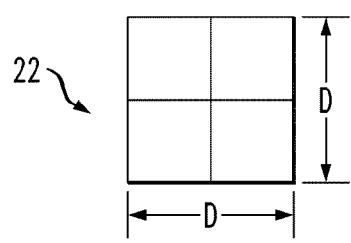

FIG. 4(*a*) is an exemplary diagram of the actual paths of several axial input rays as they pass through a configuration of collector 10 with a taper angle $\alpha=15°$. A first set rays within the interior portion of entrance 20 that aligns with exit 22 will pass straight through the collector and exit as a undeflected "beamlet", having made zero reflections off of the mirrored surfaces, as shown in FIG. 4(*a*). Another set of rays, immediately outside this first set, will make one reflection along a sidewall (for example, sidewall 18) before exiting collector 10 (for the region between L/D=1 and L/D=2) and are shown in FIG. 4(*a*) as a "one-reflection beamlet". Continuing in a similar fashion, another set of rays will reflect off of two, opposing sidewalls (e.g., sidewalk 14 and 18) of collector 10 before exiting at collector exit 22 as a "two-reflection beamlet" (as shown in FIG. 4(*a*)).

In general, rays entering parallel to collector axis CA make successive reflections at increasing angles of $3\alpha$, $5\alpha$, $7\alpha$, etc. with respect to reflective surfaces 12 and 16. These same rays are also shown in FIG. 4(*a*) as making angles 0, $2\alpha$, $4\alpha$, $6\alpha$, etc. with respect to the collector axis. FIG. 4(*b*) depicts the normalization of L/D=6/2 to 3/1, giving $(L/D)^2=(6/2)^2=9$. The diagrams of FIG. 4(*b*) illustrate entrance face 20, showing the relationship between L and D and the exemplary process used to normalize the ratio of L/D. Keeping in mind the diagram of FIG. 3, it is shown that for an exemplary angle $\alpha=2.5$ degrees, the ratio L/D=50 in zone I can be reached with an amplification A=2500. Thus, there is no theoretical limit to the amount of power which can be collected from arrangements configured from parameters within zone I of the master diagram of FIG. 3 (preferably, removed from the boundary area between zones I and II to minimize absorption and scattering losses). One works at smaller angles of $\alpha$, or simply scales up all collector dimensions for a given collector. In practice, other factors, discussed hereinbelow, should be taken into consideration, as discussed in paragraph [0047] hereinbelow.

Figure 5:
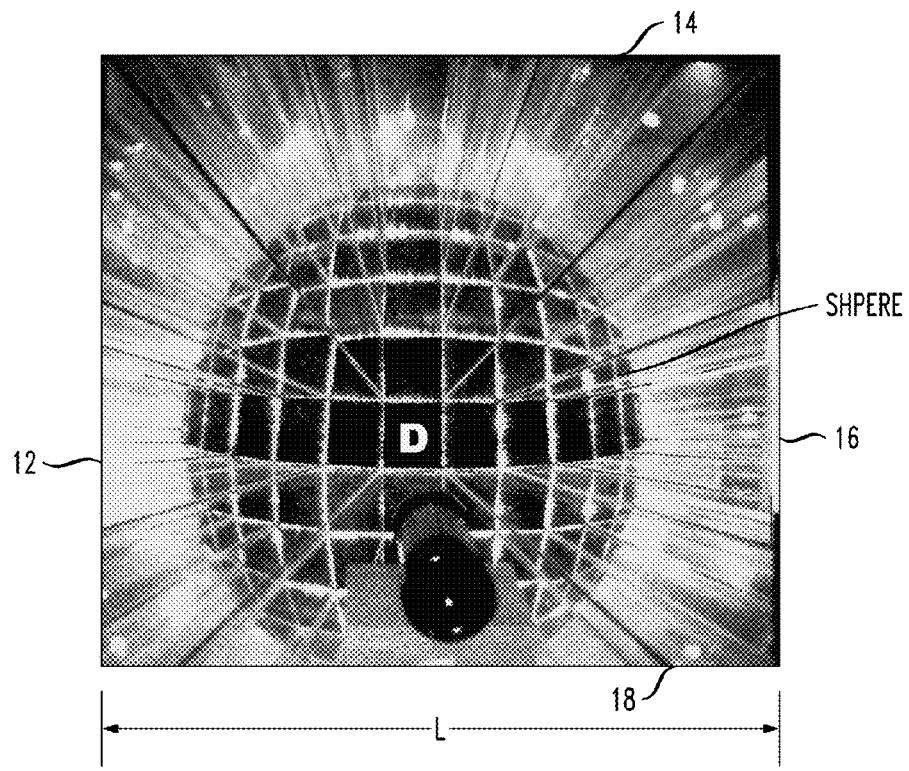
FIG. 5 shows the resulting image from the collector of FIG. 1(a), generating a Buckminster-Fullerene-type solar radiation pattern as produced by the solar collector of the present invention.

FIG. 5 is a photographic output image obtained for the arrangement of FIG. 1(*a*), looking through collector 10 from entrance 20 to exit 22. The open innermost square area shown in FIG. 5 (labeled by its dimension "D" in the image) is clearly the illuminated edge of exit 22. The radial ray-like lines arise from the illuminated junction of the four converging reflective sidewalls 12, 14, 16 and 18, which then reflect multiple times in the four sidewalls. The spherical nature of the image itself is an interesting discovery. This behavior had been fully confirmed using a laser pointer to trace along the path of an exemplary light ray and is understood as coming from the multiple reflections of the edges of entrance 20 behaving as a light source. In actuality, the "sphere" is comprised of a multi-sided polygon, formed of many linear segments of smaller size. The size of the "sphere" has been found to be relative to the area of entrance 20 and provides an intuitive indication of the amplification factor A associated with collector 10.

Figure 6:
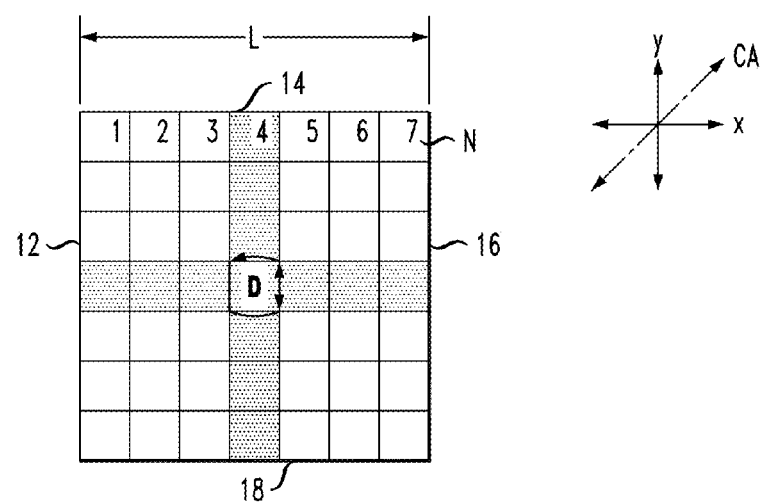
FIG. 6 is a diagram of a solar collector entrance, showing a preferred integral relationship between the area of the collector entrance and the area of the collector exit, as used to obtain a uniform output radiation intensity across the output face of the collector.

By using the pyramidal-type collector of the present invention, uniformity of intensity is achieved by making the ratio of the input face to output face (L/D) an integral value. In this case, the input area $L^2$ can be divided into an N×N array of $N^2$ smaller areas, each of area $D^2$, where with parallel input light each of the $N^2$ sub-areas is imaged onto collector entrance 20. For ideal geometry, this guarantees uniformity of intensity at the output. FIG. 6 is a diagram of collector entrance 20 for the case of N=7, showing the location of all possible input rays. The rays discussed above in association with FIG. 4 are shown as the shaded beamlets in the view of FIG. 6. Of the 49 beamlet regions in this arrangement, the shaded area accounts for 13 of the beamlets. These include the "straight through" beams from the central square (associated with L/D=1) and the other six beamlets diverging along the x and y axes. The remainder of the beamlets will reflect off of all surfaces 12, 14, 16 and 18 and result in a fan of diverging beamlets as they leave exit 22, as shown in FIG. 4(*a*). In this case, the arrangement yields an image including one original sun and 48 "virtual suns". Again, this illustrates the collector efficiency improvement of the present invention over the prior art.

In implementation, there are other factors to be considered which make the use of small angles of $\alpha$, and the associated large amplification, impractical. In particular, it is unfavorable to have many emerging beamlets exiting collector 10 at large angles with respect to collector axis CA. Such beamlets will strike the absorbing solar cell (or absorbing thermal fluid) at small angles of incidence where surface reflectivity is high. Another undesirable factor is that reflections close to normal incidence will contribute to local heating and scattering loss, while making little or no contribution to amplification (on a per reflection basis).

In contrast, favorable collector parameters may comprise the following values: (L/D)=15, A=225, (S/D)=105 and D=10 cm. These values will yield an L of 1.5 m and a value for S of 10 m, with an input power of 1.5 kW at "one-sun" insulation. To work at yet higher power, additional PV collector units may be added, or all of the collector dimensions scaled upward by the same factor.

The above analysis has related to the use of pyramidal collectors with rays entering parallel to the collector axis. In the case where the sun's rays enter at an angle with respect to the axis, it can be shown that the collected power falls only slowly over an acceptance angle approaching $2\alpha$. This value of $2\alpha$ is associated with the pyramidal collector geometry of the present invention, and is more than an order of magnitude less sensitive to angle than prior art collector geometries (e.g., Fresnel lenses and parabolas). As a result, the insensitivity to angle eliminates the need for expensive, feedback-controlled two-axis tracking apparatus, as used with conventional solar collector systems (which are extremely sensitive to small collector misalignments).

Instead, a relatively inexpensive two-axis tracker (no feedback required) can be used to orient the inventive collector during the full course of the day while operating at close to full power. Another major attribute of the large collection angle of $2\alpha$ is that the collection system can continue to operate at quite high efficiency—even under cloudy or hazy skies—where parabolic collectors are inoperable. A further benefit of the wide acceptance angle is that the collectors themselves need not be high-precision devices and are tolerant of flaws in collector geometry, such as distortions from rippled mirror surfaces.

Figure 7:
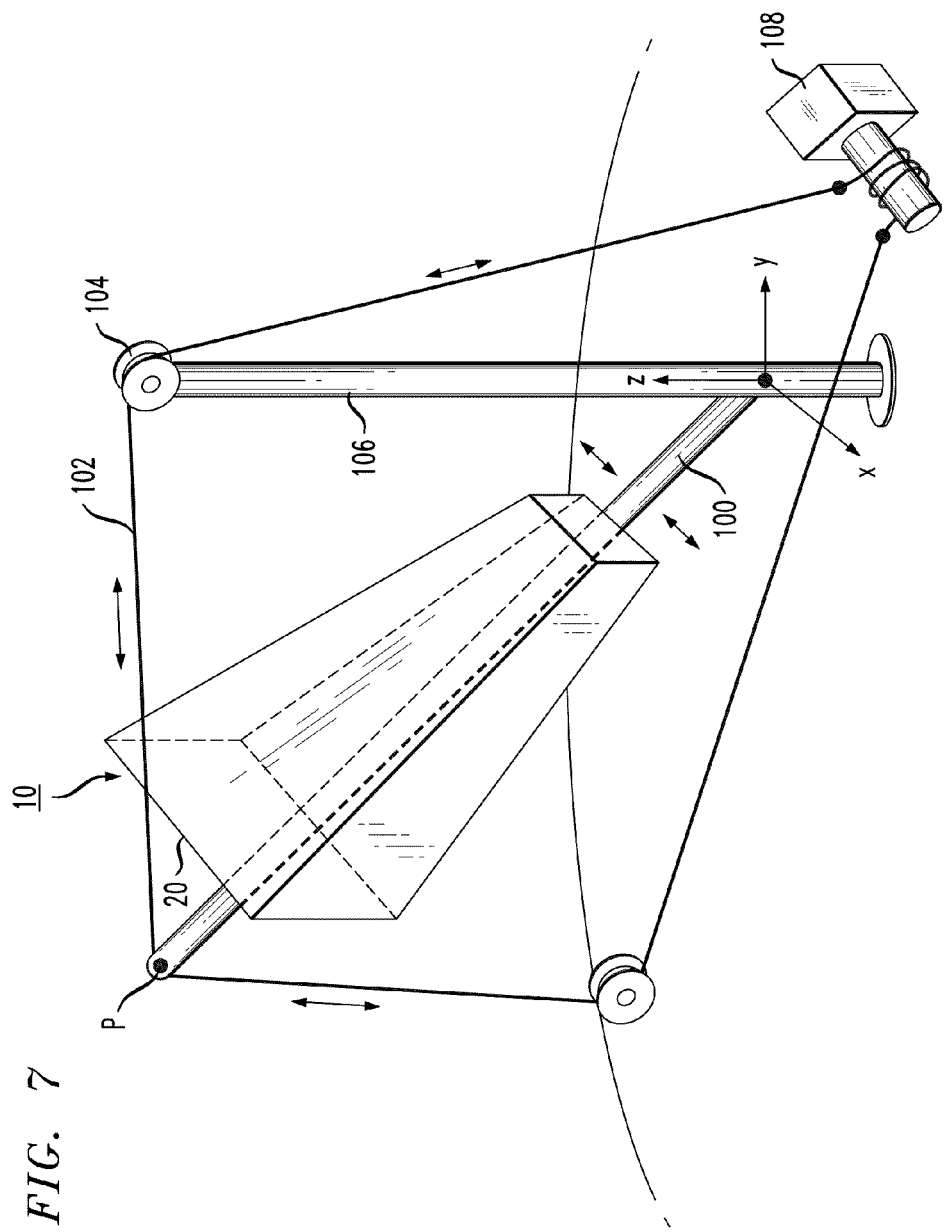
FIG. 7 illustrates an exemplary solar collector of the present invention, mounted on a boom structure to provide simple (i.e., non-feedback) tracking.

In a residential application, a square pyramidal collector, such as collector 10 of FIG. 1(*a*), may be directly mounted onto a house, or located in an area immediately adjacent to the house. FIG. 7 illustrates an exemplary collector 10 mounted onto a boom 100. A first cable 102 is attached to boom 100 at point P, near entrance 20 of collector 10. First cable 102 then passes through a pulley 104 at the top of an associated pole 106. A small motor 108 is connected to first cable 102 at ground level and used to continuously (i.e., no feedback) vary the elevation angle of collector 10 at a constant rate. If pole 106 can itself be rotated about a vertical axis, the azimuthal angle of collector 10 can also be varied using the same motor through a second cable (not shown) to rotate pole 106 about its axis and thus also rotate collector 10. This relatively simple two-axis tracking system is considerably less expensive and complicated than the tracking systems required for conventional solar concentrators based on parabolic reflectors or Fresnel lenses. Moreover, the pyramidal collectors of the present invention are lightweight and inexpensive, requiring only a simple mechanical support structure (indeed, a ziggurat-type structure has been used in construction of an exemplary collector).

Figure 8:
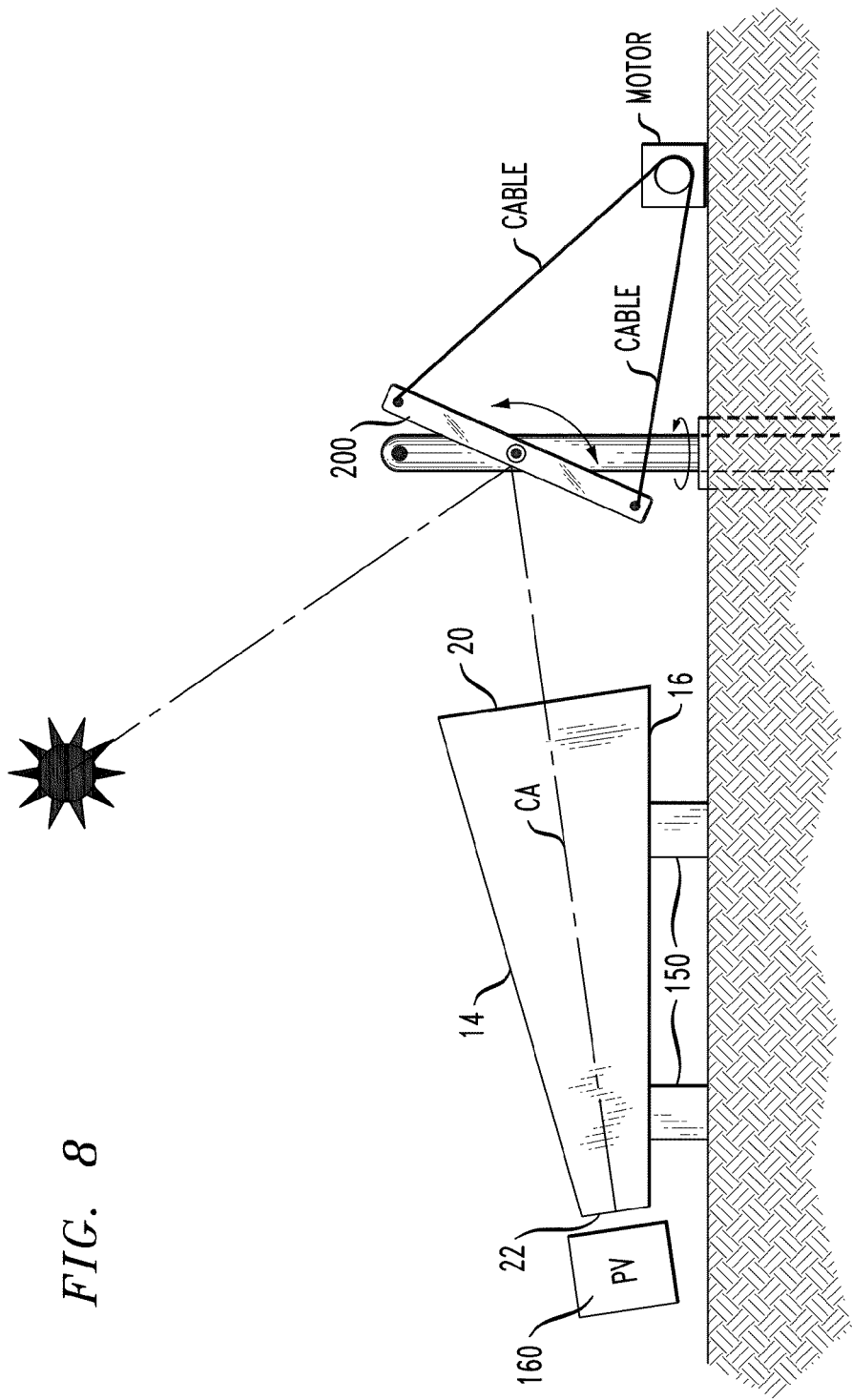
FIG. 8 is an alternative deployment of the inventive solar collector, in this case disposed in a horizontal arrangement and using a secondary mirror to direct the incoming solar rays into the collector's input face.

In situations where space is limited and access is difficult, the collector of the present invention may be disposed in a horizontal configuration with a reflective mirror (having an unobstructed view) disposed at the entrance and used to direct the incoming solar radiation into the collector. FIG. 8 illustrates this particular embodiment. Collector 10 is disposed horizontally, and is slightly raised off the ground by a support arrangement 150 (such as a pair of blocks). A PV/thermal receiver 160 is shown in this embodiment as disposed behind exit face 22 of collector 10, in a position to receive the collected and concentrated solar rays. The separate rotatable mirror 200 is disposed in front of entrance face 20 of collector 10 and is positioned to receive the incoming solar rays and direct them into collector 10, as shown. Similar to the tracking arrangement described above, a simple two-cable and motor system may be used to direct the movement of rotatable mirror 200 to follow the movement of the sun relative to entrance 20 of collector 10.

Figure 9:
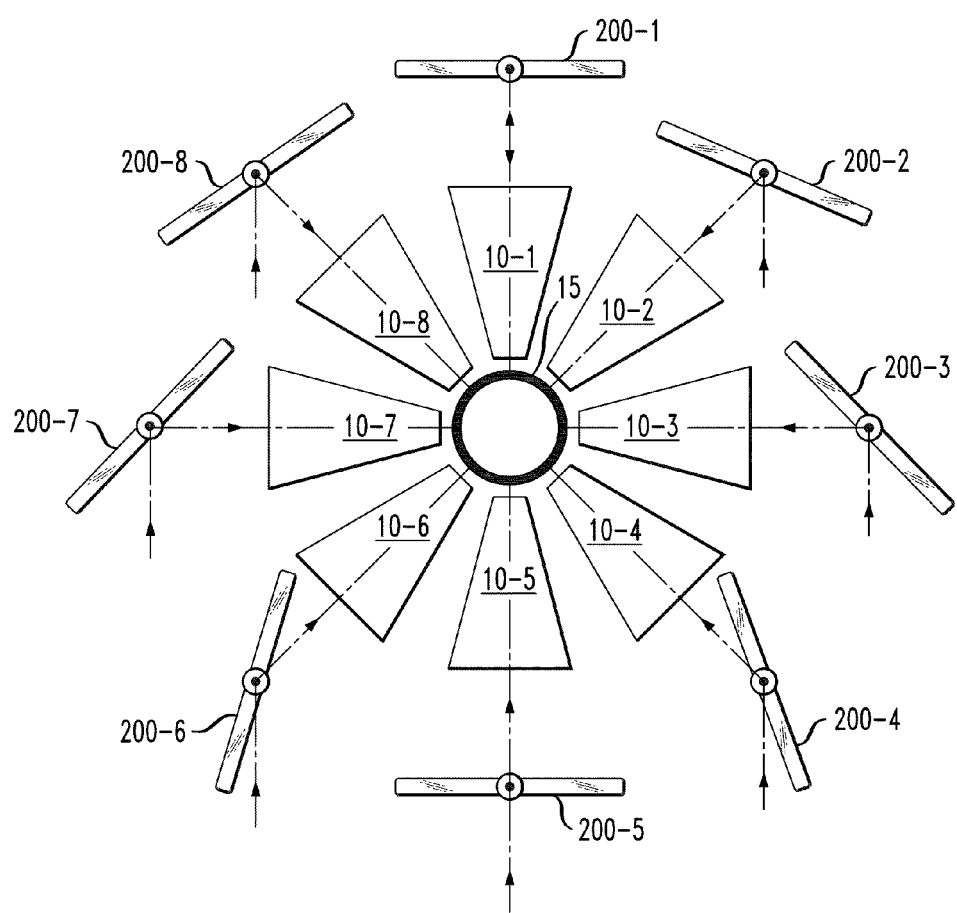
FIG. 9 is an embodiment of the present invention utilizing multiple collectors.

A system useful for implementing a larger number of the inventive collectors is shown in a top view in FIG. 9. As shown, the multiple arrangement includes eight collectors, denoted 10-1, 10-2, . . . , 10-8, each with its own feeding mirror 200-1, 200-2, . . . , 200-8. The set of collectors is arranged, in this embodiment, as a "ring", feeding a single PV (or thermal) receiver disposed in the center of the ring. In this particular embodiment, a single length of quartz tubing 155 is efficiently used as a single thermal receiver for the multiple collector arrangement, allowing for continual heating to take place.

Figure 10:
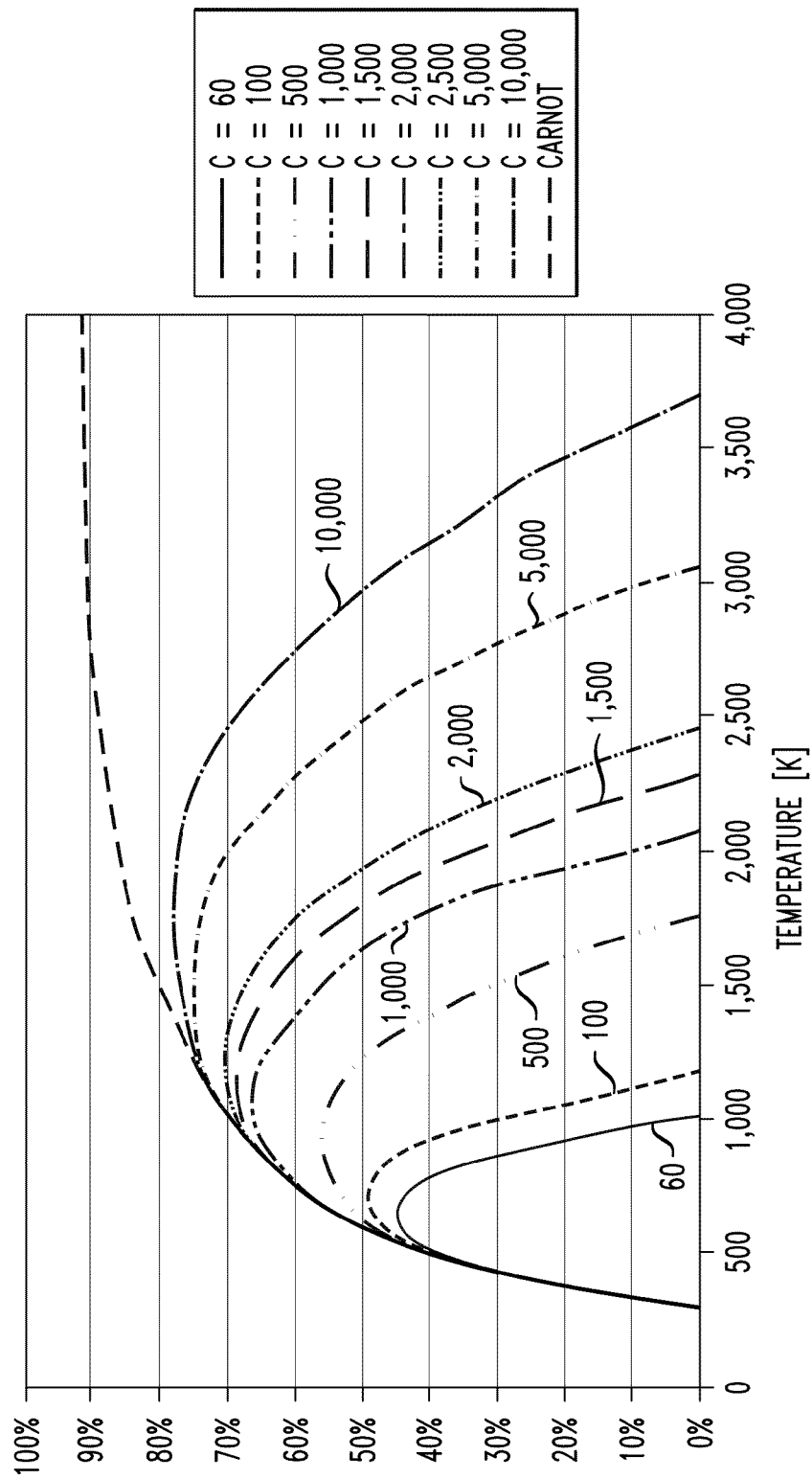
FIG. 10 depicts the ideal thermodynamic power conversion for a solar collector of the present invention.

FIG. 10 depicts the ideal thermodynamic power conversion for a solar collector of the present invention, useful in understanding the efficiencies of the collector of the present invention. In the case of the embodiment of FIG. 9, where the multiple collectors are disposed in a ring arrangement, an amplification factor A in the range of 100-1000, and with a temperature of 700° K, efficiencies between 50% and 70% can be obtained.

Figure 11:
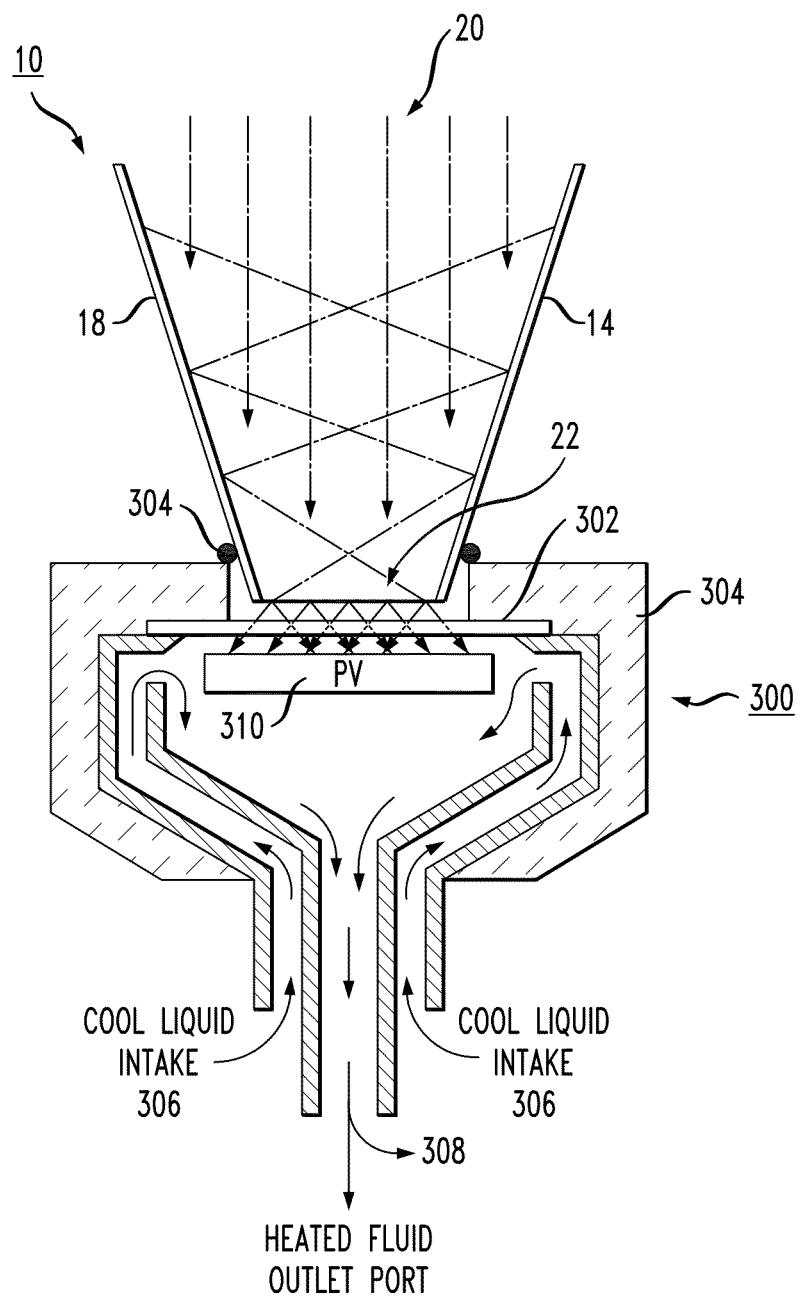
FIG. 11 shows the design of a hybrid PV and hot water system absorption chamber for use with the truncated pyramidal collector of the present invention.

It has been determined that the use of a pyramidal collector in accordance with the present invention provides easy access to heated water, and can make good use of this heat energy to provide building and hot water heat for residences and businesses (since the hot water need only be pumped into a standard water heater for later use). FIG. 11 shows the design of an exemplary hybrid PV and hot water system absorption chamber 300 for use with the truncated pyramidal collector 10 of the present invention. In order to protect the arrangement from the elements, a quartz window 302 is placed across exit face 22 of collector 10, with an O-ring 304 used to seal the connection between collector 10 and absorption chamber 300. In this particular embodiment, an outer insulating housing 304 defines the boundary of chamber 300. Any type of conventional insulative material may be used for this purpose.

In accordance with the operation of chamber 300, an incoming liquid (e.g., water, molten salt, oil, or any other fluid used in thermal systems) enters chamber 300 through inlet tubing 306. In a preferred embodiment, a metal with a high melting temperature (for example, tantalum) is used to form tubing 306. The incoming fluid is then exposed to the solar radiation concentrated by collector 10, is heated, and then flows out through an outlet port 308 in tubing 306. In the formation of this hybrid system, direct electrical energy is created by using a PV cell 310 which is disposed adjacent to quartz window 302.

It is known that silicon-based PV cells need to be maintained below a temperature of 60° C. to maintain efficient PV generation. When PV cell 310 is operating at a peak efficiency of about 25%, for example, the remaining 75% of the energy will appear as heating and be transferred to the circulating liquid. In the arrangement as shown in FIG. 11, perhaps 80% of this remaining 75% of the energy will be converted to heated fluid. As a result, the exemplary system of FIG. 11 provides a total energy conversion of 25%+(0.8)(75%), or 25%+60%, yielding an overall efficiency of 85%, which is useful for residential and business applications. Indeed, this performance greatly exceeds current solar systems.

In large-scale energy production systems, where high temperature liquids (molten salt, for example) are used, it may be preferable to forego the inclusion of a PV cell (such as cell 310), and rely solely on the generation of thermal energy through fluid circulation.

Figure 12A:
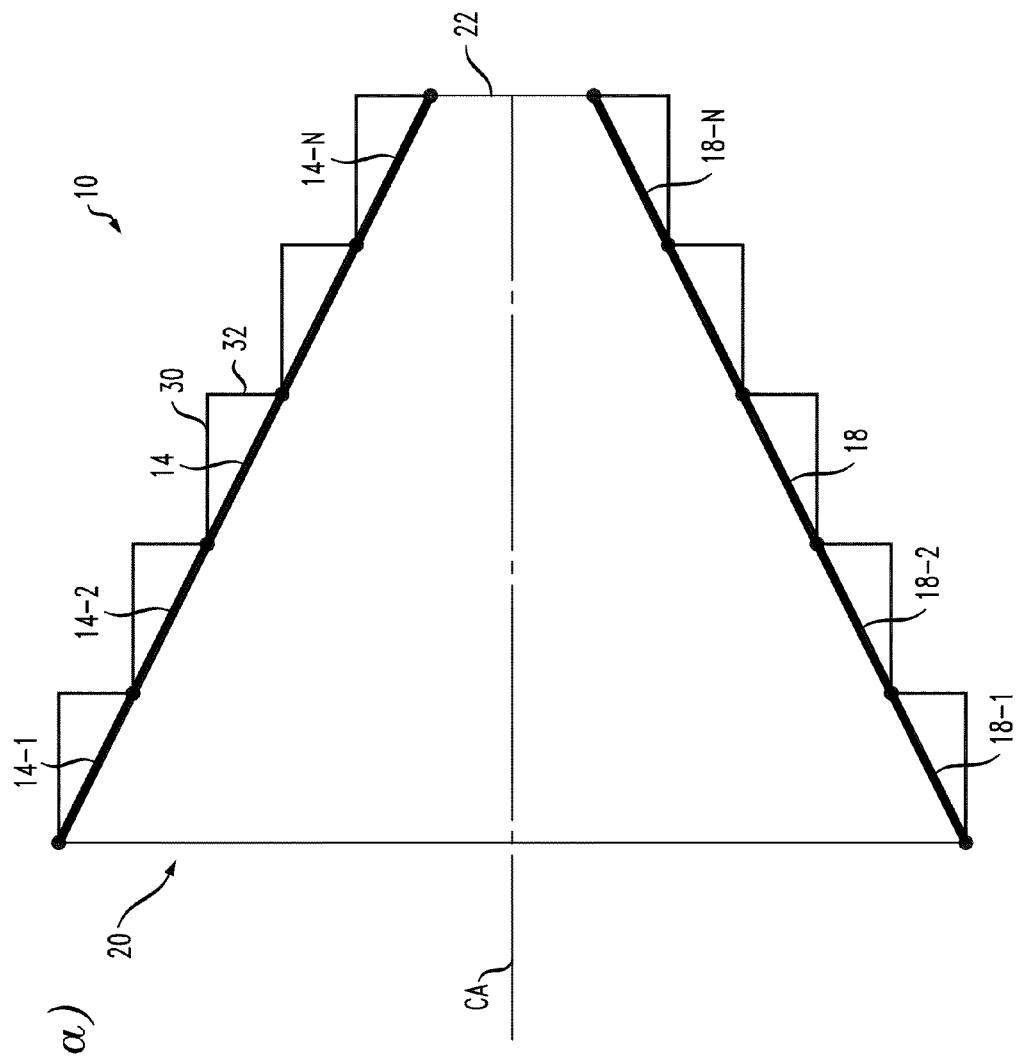
FIG. 12(a) is a side view of an exemplary ziggurat-like support structure for use with a square-based truncated pyramidal solar collector, such as shown in FIG. 1(a), where
Figure 12B:
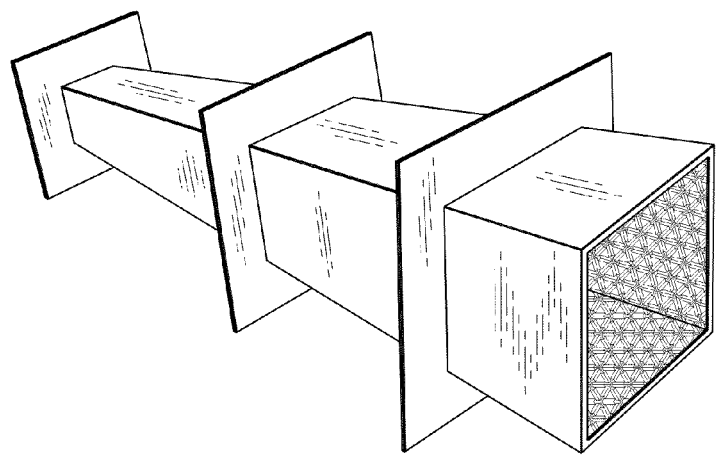
FIG. 12(b) is an experimental model of the arrangement o FIG. 12(a), as seen from the collector entrance
Figure 12C:
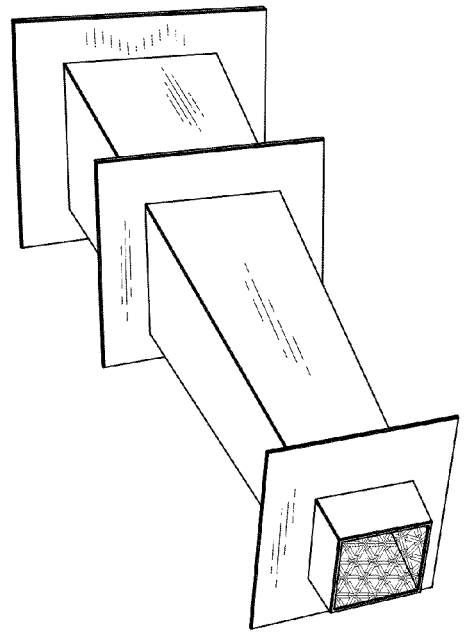
FIG. 12(c) is the same experimental model as seen from the collector exit.

As mentioned above, the specific embodiment of the present invention illustrated in FIG. 1(a) may be fabricated in a ziggurat-like construction technique in the form of a series of terraced steps from the input aperture to the output aperture that creates a rigid, yet lightweight, structure of the kind needed for low-cost pyramidal collectors. FIG. 12(a) shows an exemplary ziggurat-like pyramidal collector, showing the terraced steps configuration. There are known problems associated with the fabrication of such pyramidal structures. However, using thin, flexible, silvered foils (approximately 0.010" thick) for the flat mirrors, and a 0.07" aluminum roof flashing (or thin plywood) as backing material, it is possible to make quite high quality mirrors with low distortion. As shown in FIG. 12(a), cross-bars 30 are attached to the outside of sidewalls 12, 14, 16 and 18 at intervals as shown to prevent the mirrors from collapsing inward toward the collector axis CA. Square plywood plates with square holes, shown as elements 32, are also connected to the outside of the collector at intervals to prevent the mirrors from collapsing outward. The plastic mirrors are glued to the aluminum flashing (or plywood) with a material such as a spray glue. There is very little rippling of the plastic film material upon drying. Liquid glues are mostly water and not as appropriate for this application. Rubber cement has also been found acceptable. In combination, ziggurat elements 30 and 32 make a very rigid structure, even with quite flexible materials (such as the plastic mirrors), if they are supported on a small scale. For larger collectors, as one scales up the thickness of the collector sidewalls, the cost/watt stays constant inasmuch as the collected power increases at the same rate as the increase in collector cost. Other equipment construction methods can be devised within the spirit and scope of this invention; for example, replacing the outer plates that prevent outward collapse by strong tape (such as Gorilla-brand tape) bound around the outside of the collector. FIG. 12(b) is a photograph of an exemplary collector including a ziggurat-like support structure, showing the entrance face of the collector in this view. In formation, relatively thin plywood (quarter-inch, luan material) was used in the construction with the mirrored inner surfaces formed of extremely thin (5-10 mil) reflective film. The ziggurat structure provides an impressive degree of rigidity to a structure formed of relatively "thin" materials. FIG. 12(c) is a view of the same structure from the exit face. The thickness of the materials used for this exemplary arrangement are sufficient for a collector sized for residential purposes. Obviously, when designing larger collectors for industrial or larger-area applications, the thickness of the materials will scale accordingly (while still achieving collector efficiencies orders of magnitude better than conventional arrangements).

Figure 13A:
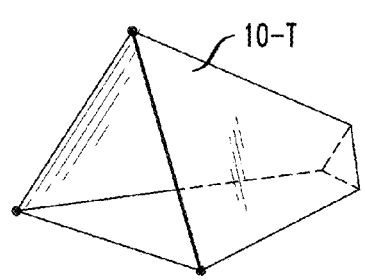
FIG. 13 shows different truncated pyramidal geometries which may be used to form solar collectors in accordance with the present invention.
Figure 13B:
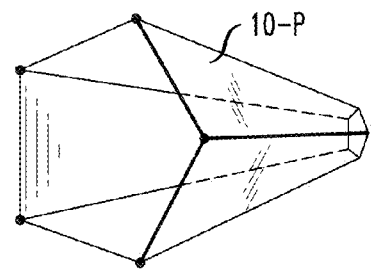
Figure 14A:
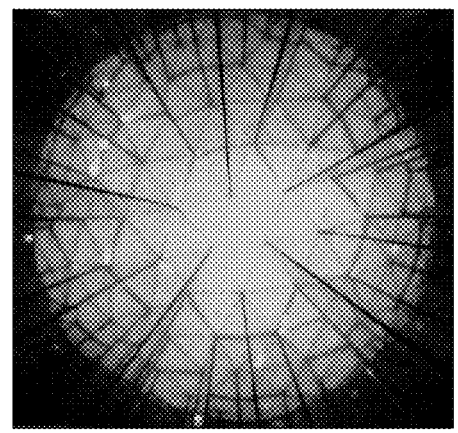
FIG. 14 depicts the Buckminster-Fullerene type images associated with the solar collector geometries of FIG. 13.
Figure 14B:
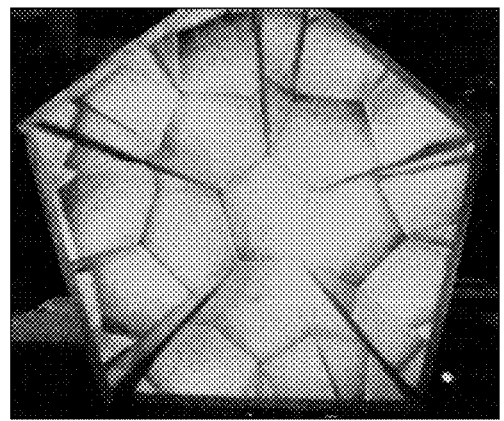

While the above discussion has been associated with the use of the collector geometry of FIG. 1(a), it is to be understood that the same principles apply to various other pyramidal collector geometries. FIG. 13 illustrate various other suitable arrangements, with FIG. 13(a) showing a simple triangular collector 10-T embodiment of the present invention. A truncated pentagonal pyramid solar collector 10-P is shown in FIG. 13(b). In each instance, a Buckminster-Fullerene type of solar image is created at the exit face of the collector, where FIGS. 14(a) and 14(b) illustrate the images for the arrangements of FIGS. 13(a) and (b), respectively.

Although various preferred embodiments of the inventive solar collector have been shown and described, it will be appreciated by those skilled in the art that changes may be made to these embodiments without departing from the principles and the spirit of the invention, the scope of which is defined by the claims appended hereto.

What is claimed is:

1. A solar collector comprising
a solar receiving device; and
a truncated pyramidal structure, the truncated pyramidal structure having an entrance aperture of a first, larger area for accepting incoming collimated solar rays and an exit aperture of a second, smaller area for directing collected solar rays into the solar receiving device, a collector axis defined between the center of the entrance aperture and the center of the exit aperture, the truncated pyramidal structure further comprising a plurality of planar sidewalls disposed between said entrance aperture and said exit aperture and defining an inner cavity of said truncated pyramidal structure, each separate sidewall formed of a highly reflective material for creating multiple reflections of the solar rays within said inner cavity between said entrance aperture and said exit aperture, the plurality of sidewalls inwardly tapering between said entrance and exit apertures along said inner cavity, the taper defining an angle $\alpha$ with respect to the collector axis, where the truncated pyramidal structure is defined as having a length S sufficient to create multiple reflections of the incoming collimated solar rays, and where the areas of the entrance aperture $L^2$ and the area of exit aperture $D^2$, taper angle $\alpha$, $2.5° \leq \alpha \leq 15°$ and length S are defined in accordance with the relation $$S = \frac{\left(\frac{L}{2} - \frac{D}{2}\right)}{\tan\alpha}$$

to create multiple reflections of each solar ray and prevent reflection of the incoming collimated solar rays back through said entrance aperture and thus provide a desired collection efficiency $A=(L/D)^2$, with $1.5 \leq L/D \leq 4$ at $\alpha=15°$ and $1.5 \leq L/D \leq 50$ at $\alpha=2.5°$, the truncated pyramidal structure displaying a Buckminster-Fullerene-type solar image at the exit aperture.

2. A solar collector as defined in claim 1 wherein an essentially uniform output intensity is associated with L/D being an integer value.

3. A solar collector as defined in claim 1 wherein the solar collector further comprises a ziggurat-shaped external support system of terraced steps attached to the outer surfaces of the plurality of planar sidewalls forming the truncated pyramidal structure.

4. A solar collector as defined in claim 1 wherein the entrance aperture and the exit aperture of the truncated pyramidal structure comprise a geometry selected from the class of: circular, triangular, square, rectangular, pentagonal and hexagonal.

5. A solar collector as defined in claim 1 wherein the truncated pyramidal structure is disposed along a horizontal direction, the solar collector further comprising a separate rotatable mirror disposed in front of the entrance aperture of said truncated pyramidal structure, said separate rotatable mirror for intercepting incoming solar radiation and re-directing said radiation into said entrance aperture of said truncated pyramidal structure.

6. A solar collector as defined in claim 1 wherein the solar receiving device comprises a photovoltaic receiver disposed at the exit aperture for accepting the concentrated radiation and creating electricity therefrom.

7. A solar collector as defined in claim 1 wherein the solar receiving device comprises a thermal receiver disposed at the exit aperture for accepting the concentrated radiation and creating heated fluid therefrom.

8. A solar collector as defined in claim 1 wherein the solar receiving device comprises a hybrid photovoltaic/thermal receiver disposed at the exit aperture for accepting the concentrated radiation and creating both electricity and heated fluid therefrom.

9. A solar collection system comprising a plurality of solar collectors, each solar collector comprising
a solar receiving device; and
a truncated pyramidal structure, the truncated pyramidal structure having an entrance aperture of a first, larger area for accepting incoming collimated solar rays and an exit aperture of a second, smaller area for directing collected solar rays into the solar receiving device, a collector axis defined between the center of the entrance aperture and the center of the exit aperture, the truncated pyramidal structure further comprising a plurality of planar sidewalls disposed between said entrance aperture and said exit aperture and defining an inner cavity of said truncated pyramidal structure, each separate sidewall formed of a highly reflective material for creating multiple reflections of the solar rays within said inner cavity between said entrance aperture and said exit aperture, the plurality of sidewalls inwardly tapering between said entrance and exit apertures along said inner cavity, the taper defining an angle $\alpha$ with respect to the collector axis, where the truncated pyramidal structure is defined as having a length S sufficient to create multiple reflections of the incoming collimated solar rays, and where the areas of the entrance aperture $L^2$ and the area of exit apertures-$D^2$, taper angle $\alpha$, $2.5° \leq \alpha \leq 15°$ and length S are defined in accordance with the relation $$S = \frac{\left(\frac{L}{2} - \frac{D}{2}\right)}{\tan\alpha}$$

to create multiple reflections of each solar ray and prevent reflection of the incoming collimated solar rays back through said entrance aperture and thus provide a desired collection efficiency $A=(L/D)^2$, with $1.5 \leq L/D \leq 4$ at $\alpha=15°$ and $1.5 \leq L/D \leq 50$ at $\alpha=2.5°$, the truncated pyramidal structure displaying a Buckminster-Fullerene-type solar image at the exit aperture.

* * * * *